United States Patent [19]

Brugge et al.

[11] Patent Number: 5,271,817
[45] Date of Patent: Dec. 21, 1993

[54] DESIGN FOR SPUTTER TARGETS TO REDUCE DEFECTS IN REFRACTORY METAL FILMS

[75] Inventors: Hunter B. Brugge; Kin-Sang Lam, both of San Antonio, Tex.

[73] Assignee: VLSI Technology, Inc., San Jose, Calif.

[21] Appl. No.: 854,513

[22] Filed: Mar. 19, 1992

[51] Int. Cl.⁵ .............................................. C23C 14/34
[52] U.S. Cl. ......................... 204/192.12; 204/298.12; 204/298.19
[58] Field of Search ................ 204/192.12, 298.09, 204/298.15, 298.19

[56] References Cited

U.S. PATENT DOCUMENTS

| | | | |
|---|---|---|---|
| 4,421,628 | 12/1983 | Quaderer | 204/298.12 |
| 4,448,652 | 5/1984 | Pachonik | 204/298.12 X |
| 4,485,000 | 11/1984 | Kawaguchi et al. | 204/298.12 |
| 4,966,676 | 10/1990 | Fukasawa et al. | 204/298.12 |
| 5,066,381 | 11/1991 | Ohta et al. | 204/298.12 |

FOREIGN PATENT DOCUMENTS 2173217 10/1986 United Kingdom ........... 204/298.12

OTHER PUBLICATIONS

Vossen et al., "Thin Film Processes", Academic Press, New York, 1978, p. 41.

*Primary Examiner*—Nam Nguyen
*Attorney, Agent, or Firm*—Patrick T. King

[57] ABSTRACT

A sputter target assembly includes a main target plate formed of a refractory material, such as Ti/W, which provides a target surface which is bombarded by ions and from which is ejected refractory material for thin-film deposition. A removable center piece is formed of a refractory material and fits within a recess formed in the center region of the main target plate to provide a surface which is substantially coplanar with the target surface of the main target. The removable center piece is attached to the main target plate with a screw formed of a refractory material. The main target plate is bonded to a backing plate for cooling.

11 Claims, 1 Drawing Sheet

DESIGN FOR SPUTTER TARGETS TO REDUCE DEFECTS IN REFRACTORY METAL FILMS

BACKGROUND OF THE INVENTION

1. Field of the Invention

This invention relates to sputtering equipment for deposition of materials and, more particularly, to improved refractory metal targets for such equipment.

2. Prior Art

Sputtering is a physical process used for the deposition of thin films. Sputtering uses the kinetic energy of accelerated ions of an inert gas, such as argon, to transfer energy to the materials of a target. Upon impact by the accelerated ions, target material is dislodged from the surface of a target. The dislodged material is then deposited on a desired substrate. Sputtering processes are used to deposit thin films of a variety of sputtered materials on a variety of surfaces. Sputtering is often used where thin-film chemical-vapor deposition (CVD) cannot be used, such as, for example, for depositing metal alloys.

Planar sputter targets are used in several of the more advanced machines for physical vapor deposition, such as the Anelva 1015, the Applied Materials Endura 5500, and the Materials Research Corporation 662. The magnetron cathode in these machines generates a broad band of erosion in the target. This produces a very uniform film of deposited metal and fairly uniform step coverage at surface discontinuities.

However, the symmetric magnetic field generated by some of the cathodes results in a single erosion groove in the sputter target, leaving other areas of the target which are not eroded. During the sputtering process, some metal is scattered back toward the target and is deposited onto the non-eroded areas of the target, producing multiple layers of re-deposited material. For refractory metals, temperature cycling of these multiple layers of re-deposited material causes delamination or peeling of these re-deposited layers from the target. This delamination or peeling phenomena produces flakes of material which produces defects in the sputtered thin-films deposited, for example, in the fabrication of semiconductor integrated-circuits, resulting in greatly decreased product yield.

One technique to attempt to avoid this problem is to modify the cathode design so that the magnetic field sweeps the plasma across the entire target surface to provide erosion of the entire surface of the target area. Because there are no areas of the target where a film can build up by re-deposition of the sputtered material, there is no occurrence of delamination or peeling of re-deposited material from the target.

Another technique to avoid delamination is to roughen the surface of the center of the target to increase adhesion of the re-deposited film. However, the roughened area of the target can become a constant source of film defects if the size of the roughened area does not exactly match the size of the non-eroded area of the target.

Consequently, the need has arisen for a technique to reduce the yield of integrated-circuit product by eliminating the peeling and flaking of re-deposited materials from the non-eroded areas of refractory metal sputter targets, while not contaminating the film being deposited. It is desirable that the technique work with existing cathode designs and be cost effective.

SUMMARY OF THE INVENTION

It is therefore an object of the invention to provide a technique for reducing peeling and flaking of re-deposited material from refractory metal sputter targets.

In accordance with this and other objects of the invention, a composite sputter target is provided which has three components, a main target, a removable center of the target, and means for attaching the center of the target to the main target, including a special screw. Using this design, the center of the target is removed during routine maintenance of the sputter chamber before the re-deposited film begins to peel from the surface of the target. Then a replacement center piece is attached with a special screw. The composition of the removable center piece and the screw matches the bulk composition of the sputter target or one of the elements of a composite sputter target to maintain the purity of the deposited film. To prevent contamination of the sputtered film by a bonding material, the center piece is not attached directly to a backing plate for the target. The center piece is thinner than the target and is mounted to the target. To enhance heat transfer from the target to the center piece, both the bottom of the removable center piece and the corresponding surface of the center piece are flat and polished.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
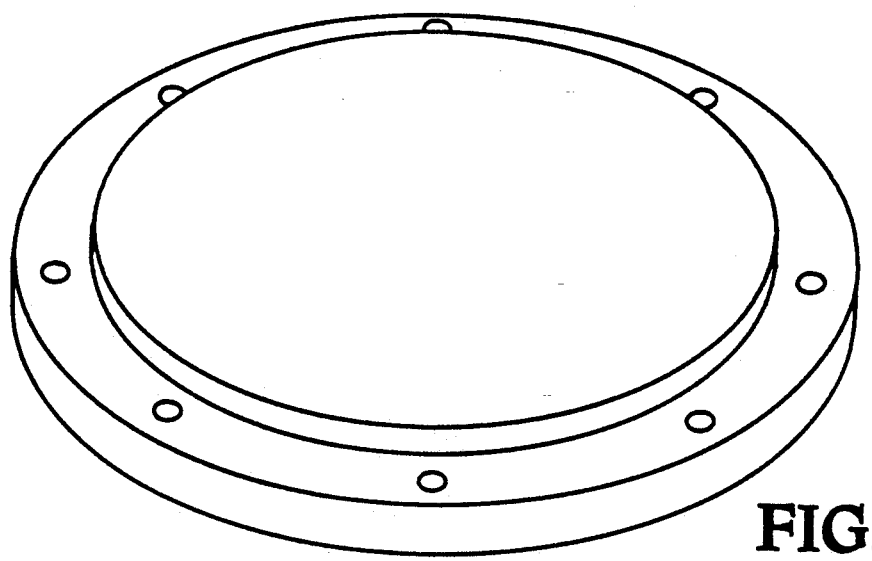
FIG. 1 is a perspective view of a conventional sputter target.

FIG. 1 shows a perspective view of a conventional sputter target assembly. The target is a thin TI/W disk of 10% Ti, which is fixed to a copper backing plate. The target has a diameter of 280 mm. and a thickness of 6 mm.

Figure 2:
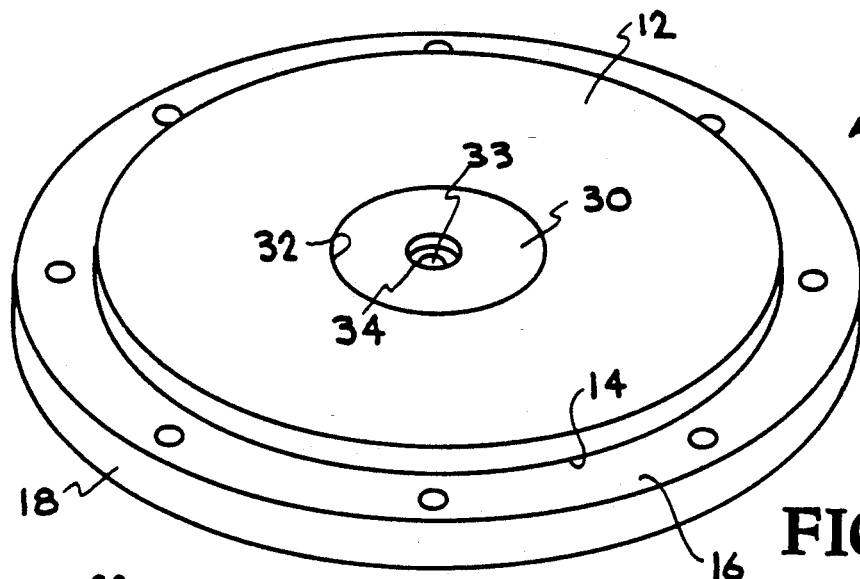
FIG. 2 is a sectional view of a sputter target assembly having a removable center piece.
Figure 3:
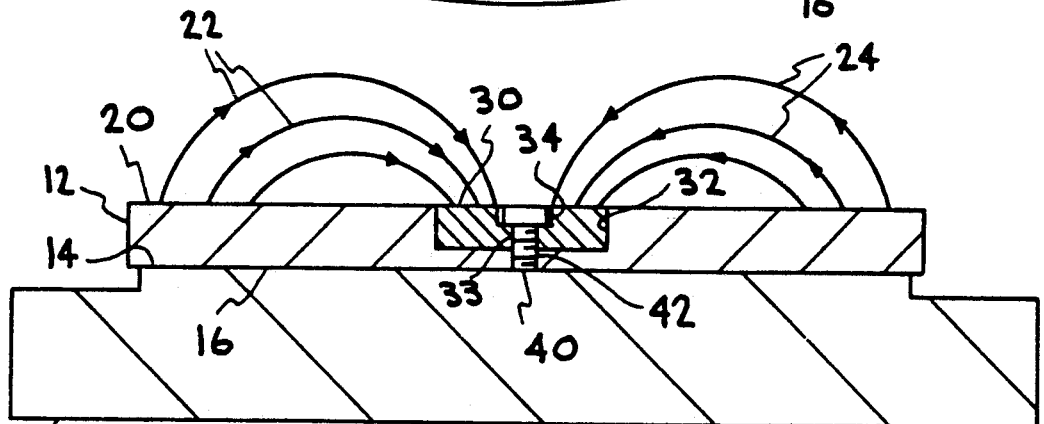
FIG. 3 is an exploded, perspective view of a sputter target assembly, according to the invention.

FIGS. 2 and 3 show a composite sputter target assembly 10, according to the invention, for use in a magnetron sputter deposition system. A main target 12 is formed as a thin plate, or disk, of a refractory material such as TiW. The main target 12 is mounted to the cathode structure of the magnetron by having its back surface 14 fixed to the front surface 16 of a copper backing plate 18. The back surface 14 of the target 12 is bonded to the front surface of the backing plate 18 using a conductive epoxy material or by soldering. Epoxy-bonding requires that the target 12 be well cooled to avoid epoxy shrinkage, outgassing, and power losses at elevated temperatures. Solder-bonding requires that the respective adjacent surfaces 14,16 of the target 12 and the backing plate 14 have metallized layers former thereupon which are suitable for soldering. An advantage of the soldering technique is good thermal connection, high temperature operation, and good bonding strength. Replacement of a target solder-bonded target requires the entire target/backing plate assembly be removed and replaced.

FIG. 3 shows trajectories (typically shown as 22,24) for sputtered material which is knocked from the front surface 20 of the target 12 and which is scattered back to the target 12. The symmetric magnetic field of the cathode produces an erosion groove on the front surface 20 of the target 12 in areas away from its center as the front surface 20 of the disk 12 is bombarded by argon ions. This leaves the center region of the target 12 not eroded. During the sputtering process, some metal is scattered back toward the center of the target and is deposited onto the non-eroded center areas of the target, producing multiple layers of re-deposited material. Temperature cycling of these multiple layers of re-deposited refractory material causes delamination or peeling of these re-deposited layers from the center region of the target, producing contaminating flakes. If nitrogen is added to the plasma to improve the barrier properties of the film. Titanium nitride is formed which also have a tendency to flake and break off.

The invention provides a removable center piece 30 for the target assembly 10. The center piece 30 is formed as a thin disk of material which is the same or similar to the material of the main target 12. A recess 32 having the same diameter as the center piece 30 is formed through the front surface 20 of the target 12 to the same depth as the thickness of the center piece 30. The bore 32 receives the center piece 30. The center piece has a smaller bore 33 formed through its center. A larger concentric countersunk bore 34 is also formed through the center of the center piece, as indicated in the Figure.

Means are provided for attaching the center piece 30 of the target within the recess 32 formed in the main target 12. A special screw 40 is formed of material which is either the same as or similar to the refractory material of the target 12. The screw 40 extends through the bore 33 and threads into a threaded bore 42 formed in the base of the recess 32 in the target 12. The head of the screw 40 is recessed in the bore 34 formed in the center piece 30.

Using this design, the center piece of the target can be easily removed during routine maintenance or during a scheduled shield change. At that time not enough re-deposition of refractory material will have occurred so that flaking and peeling of the re-deposited layer will not happen. A replacement center piece 30 is then attached to the main target 12 using the screw 40.

To prevent contamination of the sputtered film by the material which bonds the target 12 to the backing plate 18, the center piece 30 is not attached directly to the backing plate 18. The center piece 30 is thinner than the target and is mounted to the target within the recess 30. To enhance heat transfer from the target 12 to the center piece 30, both the bottom surface of the removable center piece 30 and the corresponding recessed surface of the target 12 are flat and polished.

The target 12 is a (10% Ti, W) plate having a diameter of 280 mm. and a thickness of 6 mm. The recess 32 formed in the target 12 has a diameter of 50 mm. and a depth of 3 mm. The removable center piece 30 is smaller (10% Ti, W) plate having a diameter of 50 mm. and a thickness of 3 mm. The screw 40 is formed of (10% Ti, W).

The targets are very expensive, costing greater than ten thousand dollars each, so that any technique to increase their useful life is welcome. Internal shielding is routinely changed within the deposition chamber during routine maintenance every 1500 wafers. The target remains within the machine. By changing the center piece at one of these routine maintenance times, it is possible to extend the life of a target so that twice as many wafers can be processed. For example, instead of replacing an entire target after ten thousand wafers are processed, the entire target needs to be replaced only after twenty thousand wafers are processed.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A sputter target assembly providing refractory sputtered material for deposition on a substrate, comprising:
   a main target plate formed of a refractory material, said target plate formed as a thin disk having a target surface which is bombarded by ions and from which is ejected refractory material, said main target plate having a predetermined thickness, said main target plate having a recess formed in its center region;
   a removable target center piece formed of a refractory material, said removable center piece having a shape substantially conforming to the recess formed in the center region of the main target plate, said removable target center piece having a surface which is substantially coplanar with the target surface of the main target plate when the target center piece is inserted in the recess formed in the main target plate; and
   means for attaching said removable target center piece to the main target plate within the recess formed in the main target plate;
   whereby the removable target center piece is replaceable to assist in prevention of defects on the substrate that result from flaking of re-sputtered material from areas of the target center piece onto the substrate caused by poor adhesion of re-sputtered target material.

2. The sputter target assembly of claim 1 wherein the removable target center piece is a plate having a thickness less than the thickness of the main target plate.

3. The sputter target assembly of claim 1 wherein the main target plate is bonded to a backing plate.

4. The sputter target assembly of claim 1 wherein the means for attaching said removable target center piece to the main target plate within the recess formed in the main target plate includes a screw passing through a bore formed in the target center piece and engaging a threaded bore within said main target plate.

5. The sputter target assembly of claim 1 wherein the main sputter target plate is formed of Ti/W.

6. The sputter target assembly of claim 1 wherein the main sputter target plate is formed of 10% Ti and W.

7. A method of increasing the service life of a refractory main target for a refractory sputter deposition process, comprising the steps of:

mounting a main target formed of a refractory material in a deposition chamber, wherein the target plate is formed as a thin disk having a target surface which is bombarded by ions and from which is ejected refractory material, said main target plate having a predetermined thickness, said main target plate having a recess formed in its center region;

inserting a removable target center piece formed of a refractory material in the recess, said removable center piece having a shape substantially conforming to the recess formed in the center region of the main target plate, said removable target center piece having a surface which is substantially coplanar with the target surface of the main target plate when the target center piece is inserted in the recess formed in the main target plate; and attaching said removable target center piece to the main target plate within the recess formed in the main target plate; and replacing the removable target center piece with another removable target center piece to prevent defects on the substrate that result from flaking of re-sputtered material from areas of the removable target center piece onto the substrate caused by poor adhesion of re-sputtered target material.

8. The method of claim 7 including the step of attaching said removable target center piece to the main target plate within the recess formed in the main target plate.

9. The method of claim 7 wherein the step of attaching said removable target center piece to the main target plate within the recess formed in the main target plate includes passing a screw through a bore formed in the target center piece and engaging a threaded bore within said main target plate with the screw to attach the removable target center piece to the main target plate.

10. The method of claim 9 including the step of forming the main sputter target plate from Ti/W.

11. The method of claim 10 including the step of providing the main sputter target plate from 10% Ti and W.

* * * * *